United States Patent [19]
Penkethman et al.

[11] Patent Number: 5,515,452
[45] Date of Patent: May 7, 1996

[54] OPTICAL CHARACTER RECOGNITION ILLUMINATION METHOD AND SYSTEM

[75] Inventors: John A. Penkethman, Gilroy; Robert A. Harrison, Morgan Hill; Xiaoming Wang, San Jose; Ning S. Chang, Sunnyvale; Arye Green, San Jose, all of Calif.

[73] Assignee: Electroglas, Inc., Santa Clara, Calif.

[21] Appl. No.: 999,294

[22] Filed: Dec. 31, 1992

[51] Int. Cl.$^6$ .................................................. G06K 9/00
[52] U.S. Cl. ................................... 382/141; 382/145
[58] Field of Search ..................... 382/8, 141, 145; 348/87; 356/237, 338, 368; 250/225

[56] References Cited

U.S. PATENT DOCUMENTS

| | | | |
|---|---|---|---|
| 3,597,045 | 6/1969 | Mathisen | 350/162 |
| 4,010,355 | 3/1977 | Roehrman et al. | 235/61.11 |
| 4,027,246 | 5/1977 | Caccoma et al. | 235/151.1 |
| 4,759,072 | 7/1988 | Yamane et al. | 382/8 |
| 4,764,969 | 8/1988 | Ohtombe et al. | 382/8 |
| 4,793,812 | 12/1988 | Sussman et al. | 434/116 |
| 4,794,238 | 12/1988 | Hampton | 235/462 |
| 4,811,410 | 3/1989 | Amir et al. | 382/8 |
| 5,015,097 | 5/1991 | Nomoto et al | 382/8 |
| 5,033,101 | 7/1991 | Sood | 382/30 |
| 5,172,421 | 12/1992 | Nakamura et al. | 382/8 |
| 5,177,559 | 1/1993 | Batchelder et al. | 356/237 |
| 5,263,094 | 11/1993 | Laitinen et al. | 382/8 |
| 5,265,170 | 11/1993 | Hine et al. | 382/145 |

*Primary Examiner*—Leo Boudreau
*Assistant Examiner*—Phuoc Tran
*Attorney, Agent, or Firm*—Blakely, Sokoloff, Taylor & Zafman

[57] ABSTRACT

An improved illumination method and apparatus for optical character recognition. A first light source is positioned such that light emitted from it strikes the surface at an angle of incidence. A detector is placed at the angle of reflection, such that specularly reflected light strikes the detector, providing bright field illumination. Additional light sources positioned at angles different from the first light source are disclosed to provide for high and low angle dark field illumination. Novel light guides which allow for a compact and economic system design are also disclosed. The disclosed system utilizes light sources and filters which greatly reduce the effect of environmental lighting on the optical character recognition process. A novel method to select the optimum light source and intensity is also disclosed.

19 Claims, 10 Drawing Sheets

OPTICAL CHARACTER RECOGNITION ILLUMINATION METHOD AND SYSTEM

FIELD OF THE INVENTION

The present invention relates to the field of optical character recognition, and more specifically to an optical character recognition illumination method and apparatus for use in recognizing characters on a semiconductor wafer.

BACKGROUND OF THE INVENTION

In the field of optical character recognition, an image containing characters is acquired and processed by special hardware and software that can identify the characters. For example, a camera may focus the image of an area of an object having the characters on some type of imaging array. The camera acquires an image of the character. The image is then processed by hardware and software which can identify the characters. The characters can be numbers, letters, special symbols or any other similar marking such as a bar code, for example.

Figure 1:
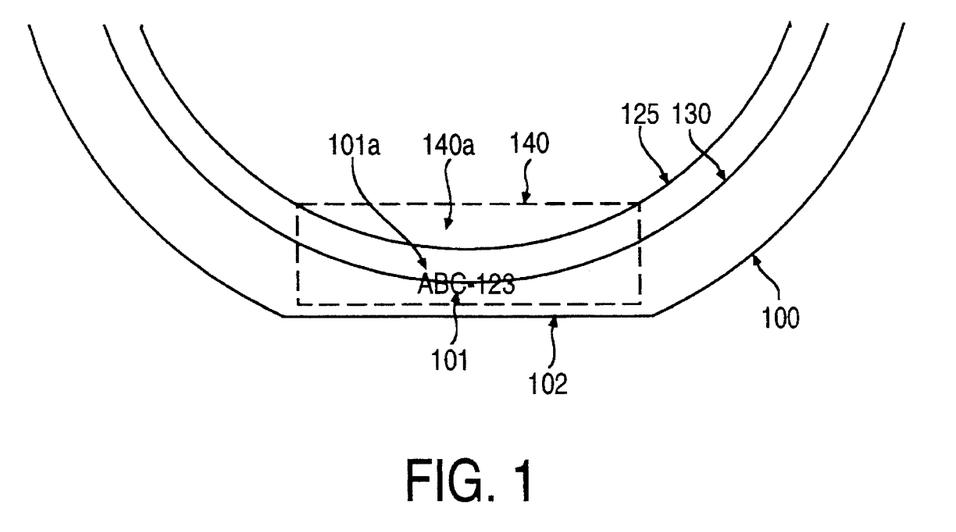
FIG. 1 shows a plan view of a portion of a semiconductor wafer with a wafer ID thereon.

Optical character recognition has use in many applications. For example, in the processing of semiconductor wafers an identifying string of characters such as letters and numbers, usually conforming to a standard character set and font, are etched onto the top wafer surface to serve as a unique identifier throughout further processing. It is very important to semiconductor manufacturers to be able to identify wafers during all processing steps. FIG. 1 shows a portion of semiconductor wafer 100 having a six character wafer ID 101. Often, as shown in FIG. 1, wafer ID 101 is placed near a flat 102 of the wafer. As is well known, wafer ID 101 may comprise a greater or lesser number of characters. The wafer ID 101 can be numbers, letters, special symbols or markings, or a combination of any or all of these.

In order for an optical character recognition system to read wafer ID 101, there must be sufficient contrast between the characters which make up wafer ID 101, for example, the character A shown as 101a in FIG. 1, and the surrounding region. In order for there to be contrast, the characters of wafer ID 101 must have different optical properties from the surrounding surface. In FIG. 1, region 140 is the area which will be focused by the camera on the imaging array and examined by the optical character recognition system. Field 140a is used to denote all of region 140 except for the characters of wafer ID 101. As is well known, the surface of semiconductor wafer 100 in the field 140a is highly reflective and is generally considered mirror-like. Therefore, light incident on field 140a reflects light specularly, and the angle of incidence equals the angle of reflection. The characters of wafer ID 101 must therefore either absorb light, reflect light in a different direction than light reflected from the field 140a or scatter light in order to generate contrast so that they can be read. In general, the wafer ID 101 is scribed on wafer 100 via laser. While the surface of wafer 100 in the region of the characters may remain highly reflective on the scale of the wavelength used to read the characters, the characters present an uneven surface so that incident light is reflected in many directions compared to light reflecting from the planar surface of wafer 100 in other regions. Additionally, while the Figures herein show scribe marks which have smooth, even surfaces which reflect light specularly at a different angle from the surface of wafer 100, at least some portions of the scribe mark are typically roughened on a microscopic scale, so that light incident on these portions is scattered in all directions.

Figure 2A:
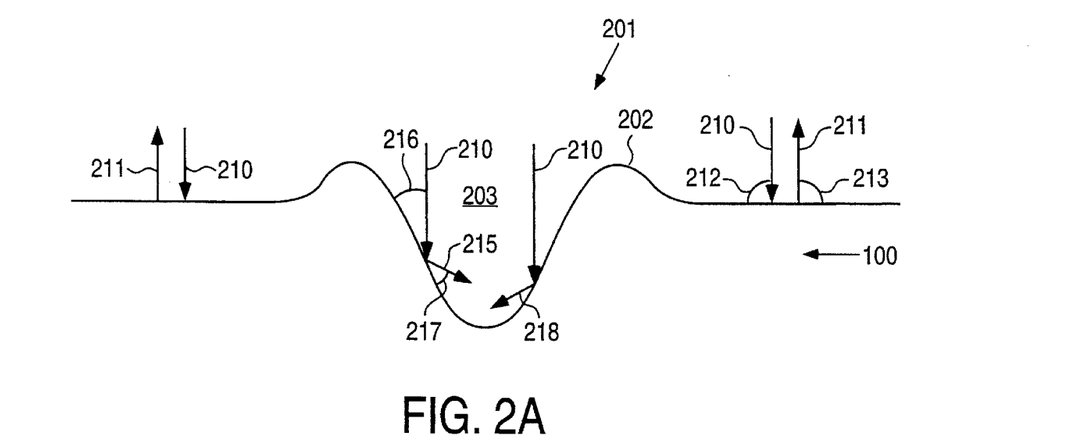
FIGS. 2A, 2B and 2C illustrate the reflection of incident light from a wafer having a hard mark type scribe.

There are many methods of scribing wafer ID 101 on semiconductor wafer 100. One method, referred to as hard mark or hard scribe, scribes a relatively deep trench (typically a few to several microns deep)into the surface of semiconductor wafer 100. Referring to FIG. 2A, a cross-sectional elevation view of semiconductor wafer 100 is shown. Scribe mark 201 could be for example a hard mark and forms a portion of one of the characters of wafer ID 101. Typically the characters of wafer ID 101 are made up of individual roughly circular scribe marks and thus are similar to dot matrix type characters. Alternatively, the characters of wafer ID 101 may be made of one or more long continuous trenches. As shown in FIG. 2A, scribe mark 201 has a kerr 202 surrounding the outer edges of trench 203. As can be seen, incident light 210 strikes the surface of wafer 100 at an angle of 90 degrees (perpendicularly). Since the surface of wafer 100 surrounding wafer ID 101 (i.e., the field 140a) is smooth and highly reflective, the angle of incidence equals the angle of reflection, and nearly all of incident light 210 is reflected straight back along the same path of the incident light rays 210 as shown by reflected light 211 (shown separated from incident light 210 for clarity).

Referring now to the incident light 210 striking the scribe mark 201 in the trench 203, it can be seen that the reflected light such as reflected light 215 and 218 is reflected in widely varying directions, depending upon the portion of scribe mark 201 which it hits. Typically, the angle of incidence and angle of reflection are measured from the normal to the surface. However, for clarity in the drawings, the complements of these angles are shown and described in the Figures and accompanying text herein. For reflected light 215, for example, the angle of reflection 217 equals the angle of incidence 216 at the point on the wafer where incident light 210 strikes. However, this surface is at an angle compared to the plane of the surface of wafer 100 and field 140a. Therefore, while some light may be directed straight back up in the direction of incident rays 210, a significant fraction such as reflected light 215 and 218, is reflected in other directions. In addition, because the surface of wafer 100 is typically roughened in at least some portions of the character, much of the incident light is scattered in all directions. Additionally, the surface characteristics may be changed such that a greater portion of incident light 210 incident on the characters is absorbed compared with the field 140a. When looked at from directly above, these differences in physical properties between the field 140a and the scribe mark 201 have the effect of making the field 140a look bright, and the scribe marks, and therefore the characters, look dark. This type of illumination is known as bright field illumination.

Figure 2B:
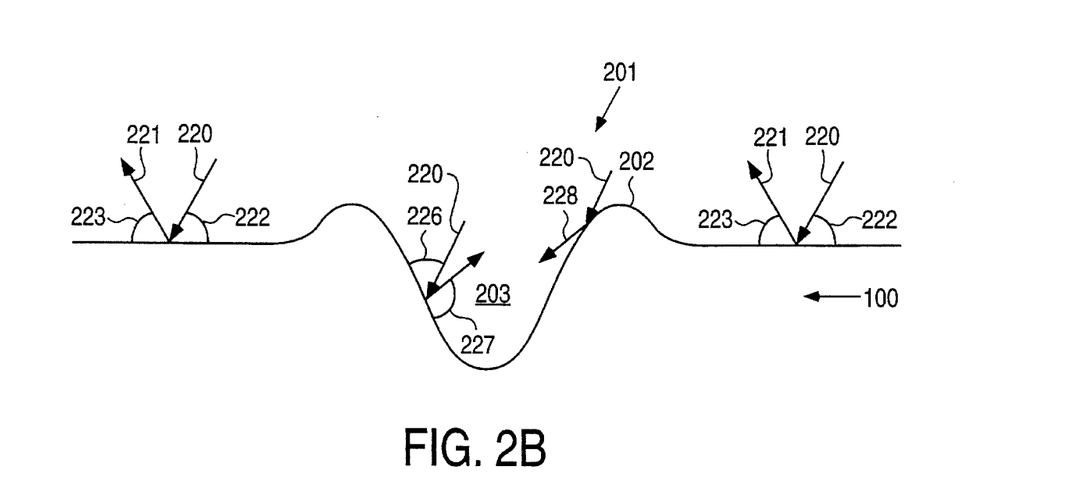

FIG. 2B shows the same cross-sectional view in FIG. 2B, however, incident light rays 220 strike the field 140a at an angle 222 of less than 90°. The reflected light 221 leaves the surface at an angle 223 which, because the surface is highly reflective and smooth, is equal to the angle of incidence 222. Again, some of incident light 220 is shown striking the surface of trench 203. The angle of reflection 227 for the reflected light 225 is equal to the angle of incidence 226 at the point the light strikes in trench 203 for some of incident light 220. Because the surface in scribe mark 201 is at an angle relative to the plane of the surface of wafer 100, very little of the incident radiation 220 in the region of scribe mark 201 is reflected in the direction of reflected light 221 from the field 140a. Again, as with FIG. 2A, FIG. 2B shows a smooth surface in the region of scribe mark 201. However, the surface on a microscopic scale may be very rough or faceted. This still has the same effect as discussed in relation to FIG. 2A, namely, that the incident radiation in the scribe mark 201 gets reflected and/or scattered in all directions, with only a small, random portion being reflected in the direction of reflected light from the field 140a. In general, with marks such as scribe mark 201, having large features out of the plane of the field 140a such as kerf 202 and trench 203, much of the light is reflected at high angles relative to the plane of the field 140a. Stated in another way, with marks such as scribe mark 201, it can be expected that at a large angle away from the angle of reflection of the field 140a, where little or no light reflected from the field 140a will be detected, there will be a significant amount of reflected/scattered radiation detected from the scribe mark 201.

Figure 2C:
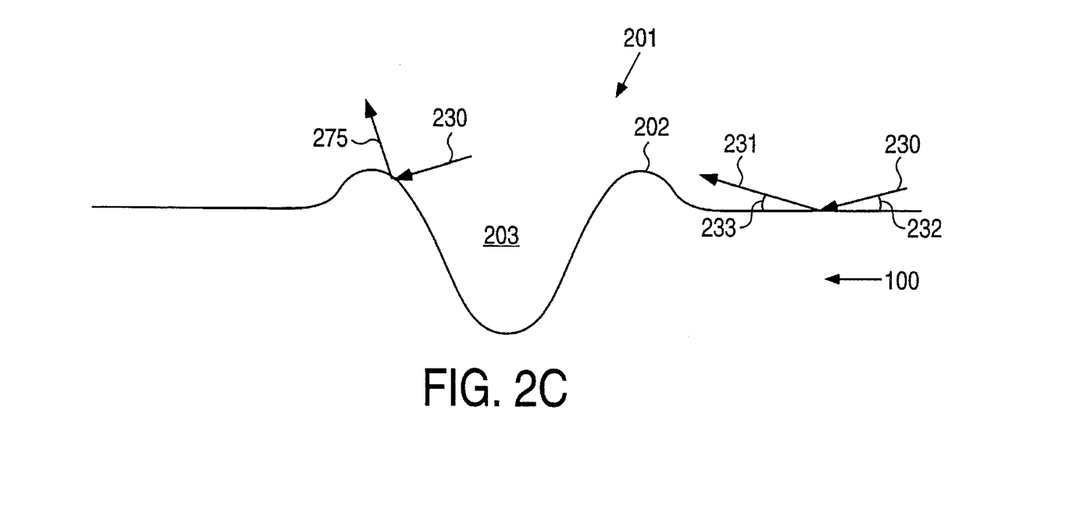

FIG. 2C shows the same cross-sectional view as FIGS. 2A and 2B. In FIG. 2C, incident light 230 strikes the field and the scribe mark 201 at a very glancing angle 232. Reflected light 231 from the field 140a is reflected at an equal angle of reflection 233. Again, as with FIG. 2A and 2B, much of incident light 230 striking the scribe mark 201 is reflected at a high angle relative to the plane of the field 140a. Because light is reflected off of scribe mark 201 at a high angle, when the region 140 is illuminated with incident light 230 at glancing angle 232, much of the light is scattered or reflected upward. Therefore, if a detector is placed, for example, directly above the region 140, the field 140a will appear dark (since most reflected light 231 is reflected in direction 231). The characters will appear bright due to the light reflected and/or scattered upward. This method of illumination is known as dark field illumination.

Figure 3:
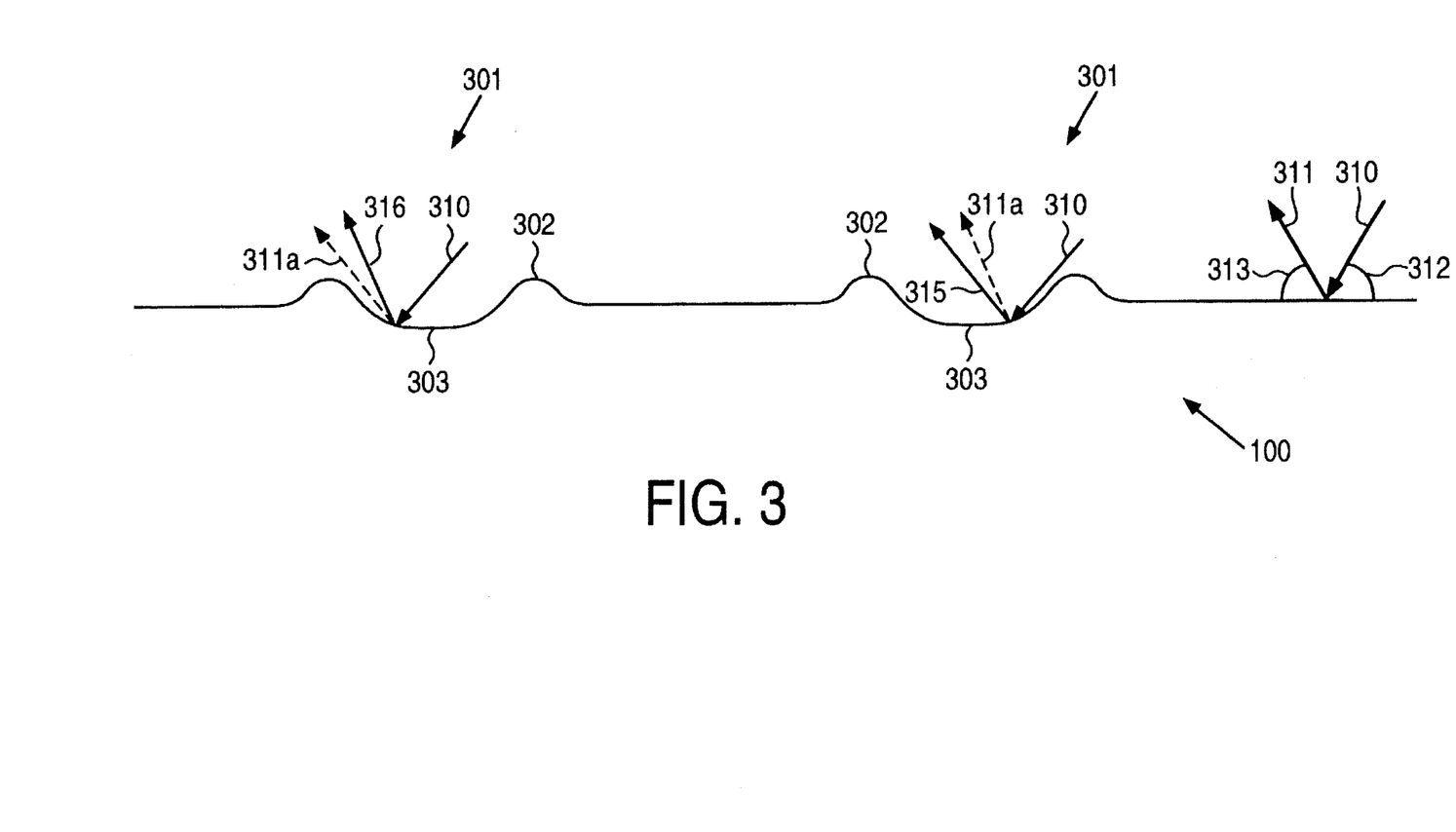
FIG. 3 illustrates the reflection of light from a wafer having a soft mark type scribe.

FIG. 3 shows two of scribe marks 301 on semiconductor wafer 100. Scribe marks 301 could be, for example, soft scribe marks. As can be seen from the Figure, the trenches 303 of the scribe marks 301 are shallower than for the mark 201 of FIG. 2. Additionally the kerf 302 is smaller. Incident light 310 strikes the field 140a of semiconductor wafer 100 at an angle 312 relative to the surface of the field 140a. Reflected light 311 from the field 140a is reflected at an angle of incidence 312. Light reflected from the scribe marks 301, such as reflected light 315 and 316 is shown together with arrows 311a, which show the direction of reflected light 311 from the field 140a. As can be seen, much of the light reflected from the scribe marks 301 such as 315 and 316, is reflected at a relatively small angle to the direction 311a. In general, shallow marks such as scribe mark 301 scatter or reflect light at a small angle relative to reflected light 311. Therefore, most of the light reflected off of scribe marks 301 will be concentrated at a small angle away from the direction of reflected light 311 from the field 140a.

The above described difference between the scribe marks 201 of FIG. 2 and scribe marks 301 of FIG. 3 creates a problem for optical character recognition systems. For example, referring to FIG. 2A, the method often used to read such characters is the bright field illumination described above. In this method incident light is directed at the characters from directly above such as incident light 210. A detector, such as a camera is placed directly above the characters. The incident light 210 is typically a collimated light beam which is injected into the optical path coaxially by use of a beam splitter. The illumination is referred to as coaxial because the illuminating light travels the same path as the reflected light which is detected. As described above, the field 140a reflects all incident radiation back, while scribe marks 201, which make up the characters, reflect in all directions. This gives rise to good contrast allowing the characters to be easily read. However, referring again to FIG. 3, as mentioned, the scribe marks 301 do not give rise to a significant degree of scattering. Because of this, if a coaxial bright field beam is used, the field will appear only slightly brighter than the characters. That is, the contrast is relatively poor. Thus the coaxial method used for reading a character with scribe marks such as scribe mark 201 cannot be used to read a character composed of scribe marks such as scribe mark 301.

Another problem encountered in optical character recognition is that some processing, such as an edge bead removal process can present lines and contrasts which are not part of the characters. Referring to FIG. 1, markings 125 and 130 are shown. Generally the markings from an edge bead removal process look like rings or bands as shown. In addition, there is often discoloration or regions of differing color between the rings, for example between ring 125 and 130. The markings from the edge bead removal process do not appear to give rise to much scattering. However, the markings such as line 125 and 130 have a different reflectivity than the surrounding surface and can confuse the optical character recognition process. For example, line 130 may make the C in wafer ID 101 look like an E when observed with bright field illumination.

A further problem with optical character recognition illumination is that light from the environment in which the optical character recognition is taking place illuminates the wafer from all directions. This tends to reduce contrast in most cases.

What is needed is a single system which can provide illumination such that all types of scribe marks can be read. Further, the system should be able to read scribe marks which have partially obscured characters due to, for example, markings due to edge bead removal processes. The system should have a reduced sensitivity to environmental lighting. Finally, the system should not require costly and complicated optics such as lenses, beam splitters, etc.

SUMMARY OF THE INVENTION

An apparatus and method for illuminating characters to be read by an optical character recognition system is disclosed. A first light source strikes the surface at an angle of incidence, the angle of incidence being greater than 0°. A detector is placed at the angle of reflection, to provide non-coaxial bright field illumination. Embodiments the invention including additional light sources are disclosed. The additional light sources provide light at an angle other than the angle of reflection, to provide for dark field illumination. Further provided are novel, inexpensive light guides, methods and apparatus for reduced sensitivity to environmental lighting, and a novel method of determining the optimum light source and intensity level.

Additional features and advantages of the present invention will be apparent from the detailed description which follows.

DETAILED DESCRIPTION OF THE PRESENT INVENTION

A improved optical character recognition (OCR) illumination method and system is disclosed. In the following description, numerous specific details are set forth such as specific materials, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although use of the OCR illumination method and apparatus of the present invention is illustrated with reference to the laser scribed marks on a semiconductor substrate discussed in the background section, it will be understood that the present invention may be used in an OCR system where characters made of any type of mark on any type of substrate are to be illuminated. Also, although the OCR illumination method and apparatus is described in conjunction with sources and detectors using light, it will be understood that the present invention can be practiced using radiation outside of the visible spectrum.

Figure 4:
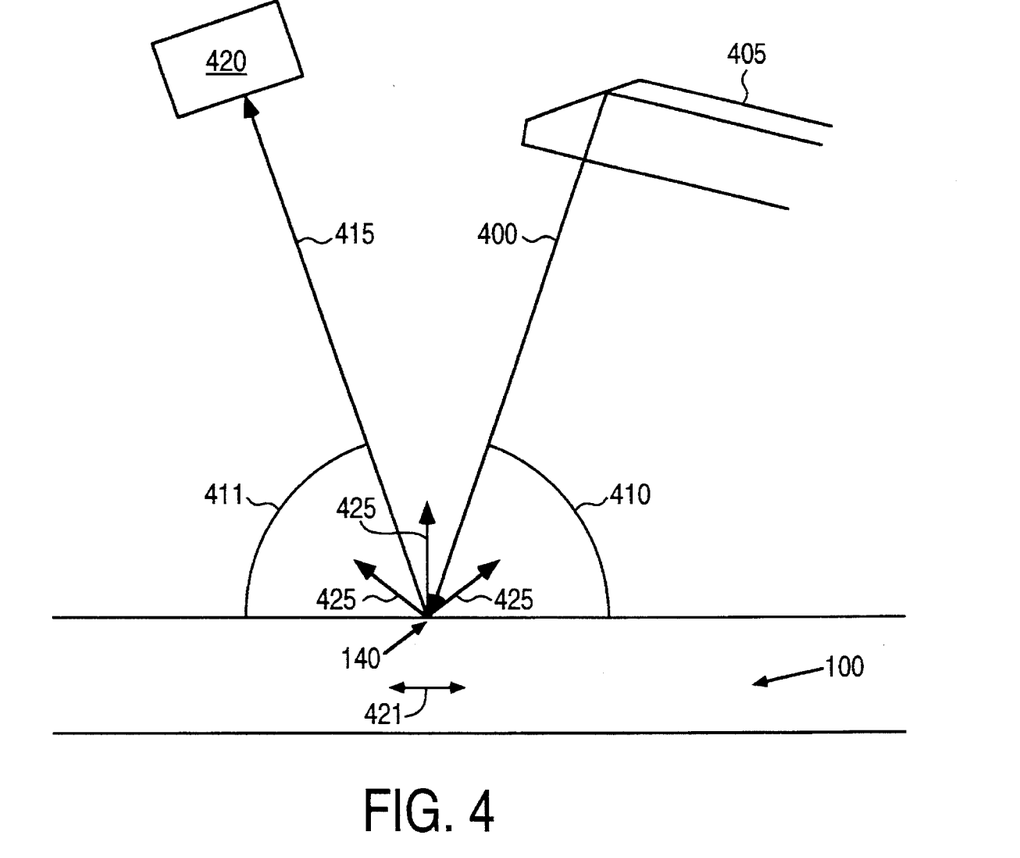
FIG. 4 illustrates the non-coaxial bright field illumination of the present invention.

Referring to FIG. 4, the non-coaxial bright field illumination of the present invention is illustrated. As shown in the Figure, incident light 400 from light guide 405 strikes the surface of semiconductor wafer 100 at an angle 410. Light guide 405 will be described in more detail below in conjunction with FIG. 5. In a currently preferred embodiment, angle 410 is approximately 85 degrees. Reflected light 415 from the field 140a is reflected at an angle 411, equal to the angle of incidence 410, or approximately 85 degrees in a currently preferred embodiment. Although a currently preferred embodiment uses an angle of incidence of 85 degrees, this angle can be varied and still achieve the objects of the invention. Detector 420 is positioned at the angle of reflection as shown. Detector 420 could be, for example, a camera which focuses an image of region 140 on an imaging array. Referring back to FIG. 2B, and the discussion thereof, it can be seen that light striking the planar field 140a will be directed into detector 420. However, light striking a scribe mark 201 will be scattered in many directions such as 225 and 228 of FIG. 2B. The incident light which is scattered from characters of wafer ID 101 is shown as 425 in FIG. 4. In detector 420, incident radiation 400 which strikes the field 140a of wafer 100 will be reflected into detector 420, and the field 140a will appear bright. Light striking the characters made of scribe marks 201 will be scattered so that only a small portion thereof will strike the detector 420. The characters of wafer ID 101 will therefore appear dark, thus generating good contrast. Since most of the radiation from the field 140a reaches the detector, making this region appear bright, while little of the light 425 scattered from the wafer ID 101 characters reaches the detector, making the characters appear dark, the apparatus and method illustrated in FIG. 4 is the bright field illumination described in the background section. It should be noted that use of a light guide providing incident radiation at an angle of incidence 410, and providing a detector at the angle of reflection 411, provides for bright field illumination in essentially the same manner as the coaxial system described earlier. However, the embodiment of the present invention shown in FIG. 4 has the advantage that no collimating lenses or beam splitters, for example, are required. In addition, since the light beam of the present invention is not highly collimated, more of the light reaches region 140, resulting in greater contrast.

Figure 5A:
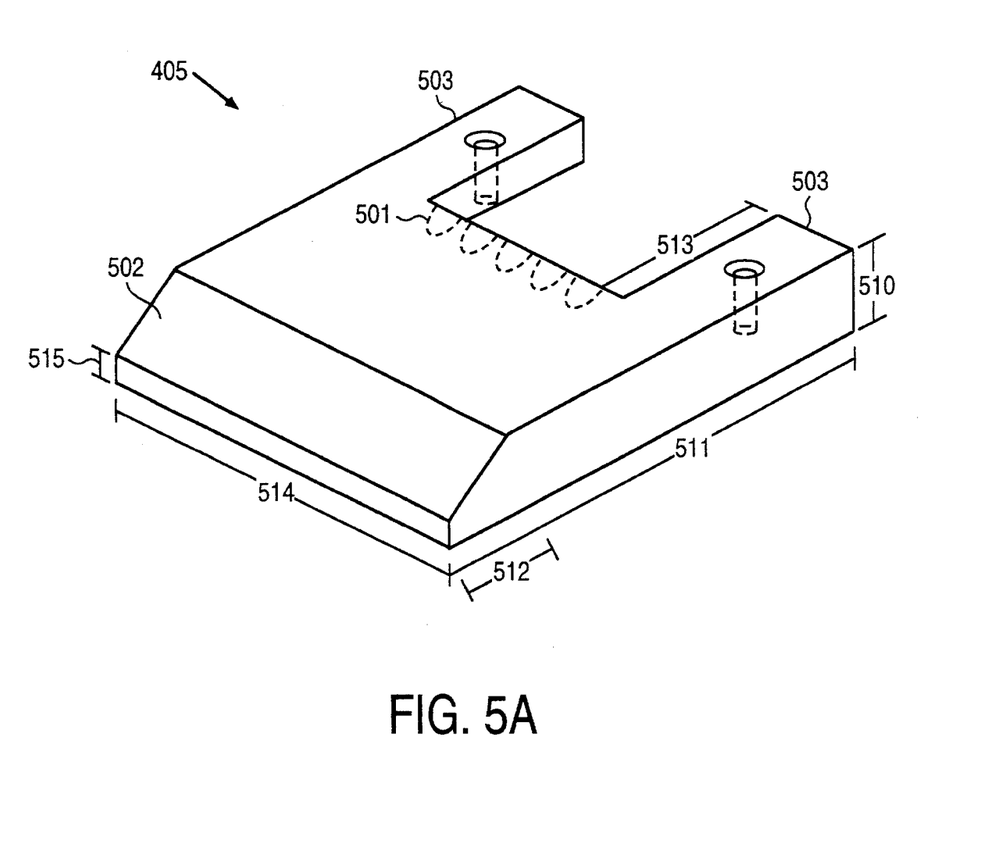
FIGS. 5A and 5B show a preferred embodiment of the bright field illumination light guide of the present invention.

FIG. 5A shows bright field light guide 405 of the present invention. In a currently preferred embodiment, bright field light guide 405 has a length 511 in the range of approximately 1½–3 inches. The width 514 of light guide 405 is in the range of approximately 2–3 inches. Light guide 405 comprises two legs 503, each having a length 513 of approximately ½ inch. The distance between the legs 503 is approximately 1 ½ inches. The height 510 is in the range of approximately ½–1 inch. In a currently preferred embodiment light guide 405 comprises five light emitting diodes (LEDs) 501. The five LEDs are mounted on a printed circuit board (PCB) assembly which is attached to the legs 513 of light guide 405. The PCB is mounted such that the LEDs 501 fit in ports provided in light guide 405. All surfaces of light guide 405, except diffuse reflecting surface 502, are polished for high reflectivity. Diffuse reflecting surface 502 is roughened to provide diffuse reflectivity. In a currently preferred embodiment, the LEDs used for bright field illumination are high power lens end, red LEDs of the AlGaAs (aluminum gallium arsenide) type. These types of LEDs have a lens, which focuses the light such that it is emitted in a solid angle of approximately 0.01 steradians. Light from the LEDs 501 travels through light guide 405 and strikes diffuse reflecting surface 502 which is at an angle of 45 degrees from the top surface of light guide 405 in a currently preferred embodiment. The light guide 405 channels most light from the LEDs 501 to the reflecting surface 502 by total internal reflection. That is, most light directed towards the upper, lower, or side surfaces of light guide 405 strikes these surfaces at an angle greater than the critical angle so that it is bounced back towards reflecting surface 502, and then down towards the wafer as shown in FIG. 4. The dimension of the front edge 515 of light guide 405 is approximately ⅛ inch. In alternative embodiments, front edge 515 is not present, and the front end of light guide 405 is triangular. Reflecting surface 502 starts a distance 512 of approximately ½ inch from the front end of light guide 405 in a currently preferred embodiment. Also in a currently preferred embodiment, light guide 405 is made of optical grade acrylic. Alternatively, glass, or other optical grade plastics can be used. The legs 503 of light guide 405 are used to mount the LED bar within the light guide 405, as described above, as well as to mount the light guide in the optical character recognition illumination system. The light guide 405 is highly transmissive, so that only a small fraction of the light from light emitting diodes is lost.

Figure 5B:
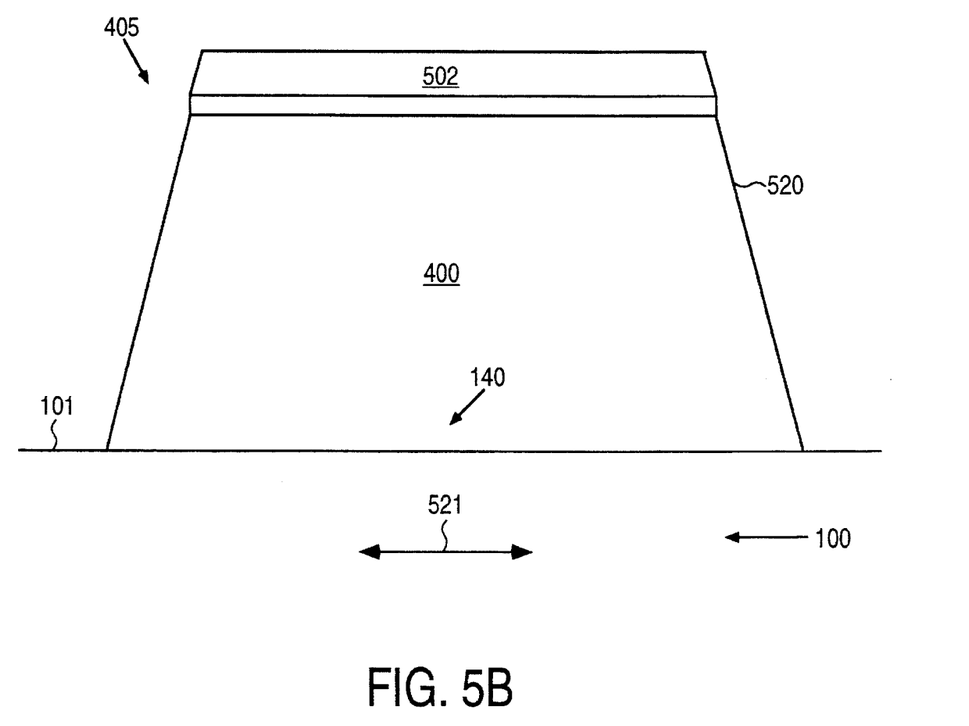

FIG. 5B shows a front, head-on view of light guide 405. As can be seen, the light beam 520 emitted from surface 502 fans out slightly (approximately 15 degrees). The light beam 520 is shown shining on the surface of semiconductor wafer 100 in the region 140. The characters making up wafer ID 101 run right to left or left to right as shown by arrow 521.

In the present invention it should be noted that the light is not collimated in the direction 521. Thus there is no loss of intensity due to collimation in this direction. Referring back to FIG. 4, the side view of light guide 405 is shown. Due to the lenses in the LED light sources, as well as the collimation provided by the light travel through light guide 405, the light is partially collimated in the direction shown as 421. For the preferred embodiment of light guide 405 described above, the light beam 400 of FIG. 4 fans out approximately 5 degrees. This amount of collimation is acceptable for optical character recognition.

Figure 6A:
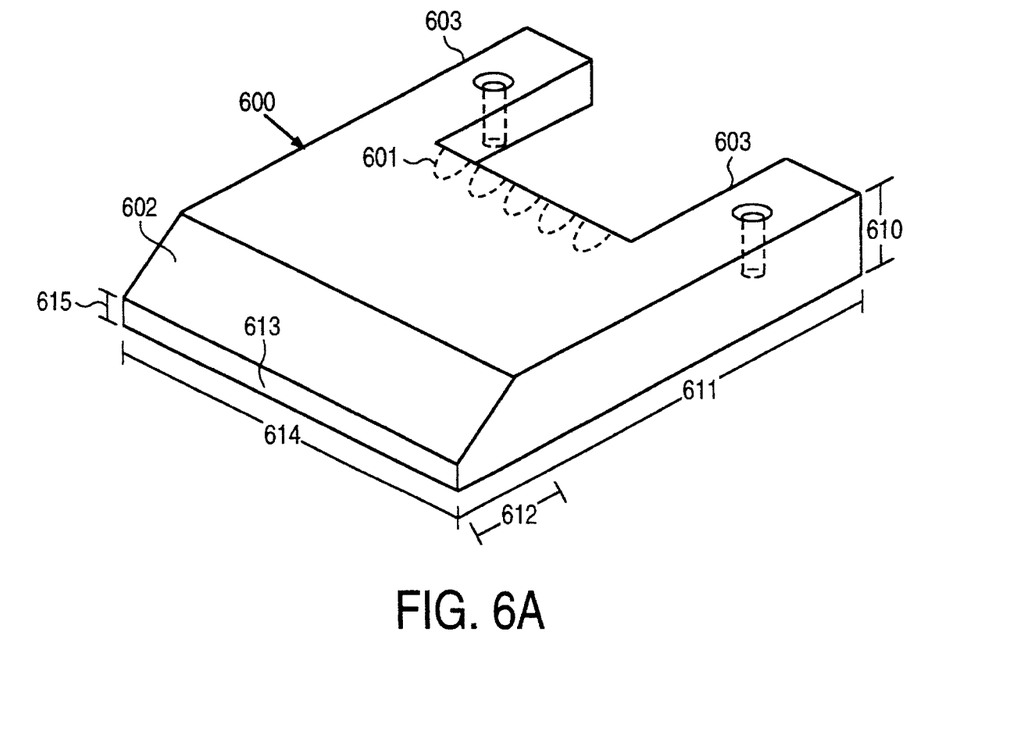
FIGS. 6A and 6B show a preferred embodiment of the dark field illumination light guide of the present invention.
Figure 6B:
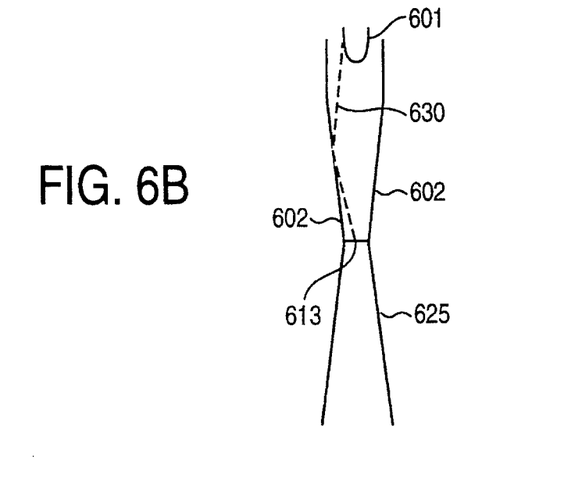

FIG. 6A shows dark field light guide 600. The use of dark field light guide 600 will be described in conjunction with FIG. 7, below. As with bright field light guide 405 dark field guide 600 is made of optical grade acrylic. The length 611 of light guide 600 is in the range of approximately 1 ½–3 inches. The width 614 of light guide 600 is in the range of approximately 1 ½–2 inches. The height 610 of light guide 600 is in the range of ¼–½ inch. Light guide 600 has two legs 603, which are each approximately ½ inch long in a currently preferred embodiment. All surfaces of light guide 600 are polished for high reflectivity. Light guide 600 comprises five light emitting diodes 601 which provide the illumination. In a currently preferred embodiment, light guide 600 uses the same type of LEDs as the LEDs 501 in light guide 405. The front end of light guide 600 comprises two tapered edges 602 which are tapered at an angle of approximately 15° relative to the top and bottom surfaces for a distance 612 of approximately ¾ inch. As light travels through the light guide 600 it is reflected off the surfaces by total internal reflection and is emitted from the face 613 of light guide 600 in a relatively flat beam of light. Face 613 has a dimension 615 of approximately ⅛ inch. FIG. 6B shows a side view of light guide 600. One ray 630 of light is shown coming from light emitting diode 601, reflecting off the left tapered edge 602 and exiting face 613. The beam 625 from light guide 600 is confined to approximately 5 degrees. With both light guides 405 and 600, although the light fans out approximately 5 degrees, the light in the center of the beam, which is aimed at region 140, is the most intense portion of the beam.

In the prior art, shielding may be necessary to block room light, increasing system cost and complexity. In the present invention, however, the effect of room lighting is reduced or eliminated without the use of shielding. Because LEDs 501 and 601 are used as a light source, the effect of room light on image contrast can be eliminated. The previously mentioned LEDs 501 and 601 emit light of a wavelength in the range of approximately 640–660 nm. A band pass filter is used in the detector which passes wavelengths greater than approximately 630 nm and which prevents all other wavelengths from reaching the detector. Typically, room lighting comprises significant amounts of light near the blue end of the spectrum, and only small portions near the wavelengths emitted by the LEDs and passed by the filter. Thus, there is very little extraneous light at the detection wavelength. Therefore, room lighting has very little effect on image contrast.

Figure 7:
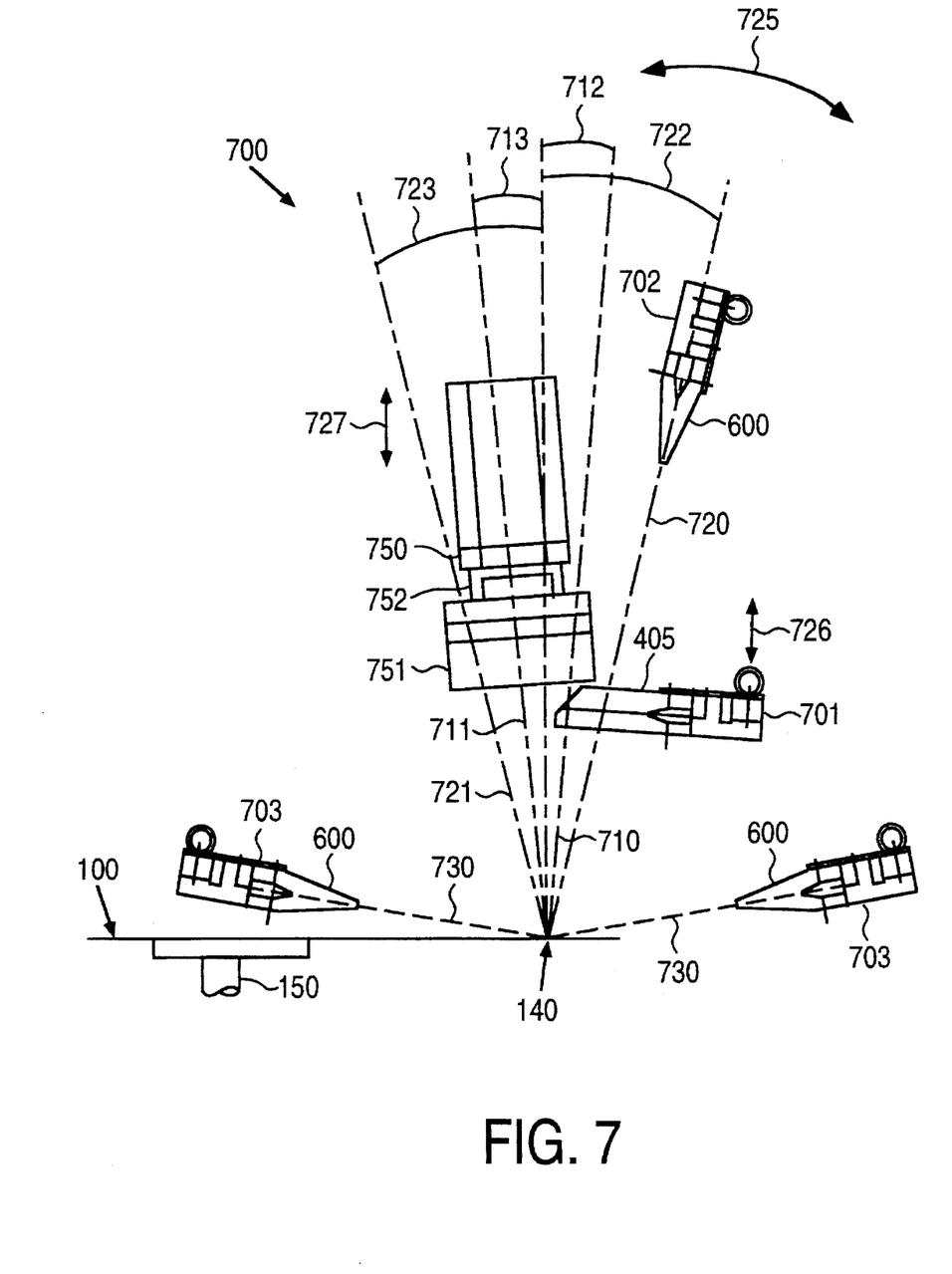
FIG. 7 shows a currently preferred embodiment of the light source configuration of the present invention.

FIG. 7 shows illumination system 700 according to the present invention which provides illumination for nearly all types of scribe marks encountered. Briefly, bright field assembly 701 with bright field light guide 405 is used for bright field illumination of the wafer. Dark field high angle assembly 702 with dark field light guide 600 is used for dark field illumination which strikes the regions 140 at a relatively high angle. Dark field low angle light assembly 703 with dark field light guides 600 are used for dark field illumination which strikes the region 140 at a relatively low angle. In the preferred embodiment, only one type of lighting is used at a time. While the embodiment described herein utilizes one bright field assembly 701, one dark field high angle assembly 702, and two dark field low angle assemblies 703, it will be understood that configurations having a greater or a lesser number of any of these assemblies may be employed. For example, dark field low angle assemblies 703 could be eliminated if this type of illumination is not needed for a particular application. Additionally, although the light guides 405 and 600 have been described as having five LEDs, the number of LEDs may be varied depending upon the particular requirements of a given application.

As mentioned above, bright field assembly 701 is used for bright field lighting. That is, incident light 710 strikes the region 140 of wafer 100 at an angle 712 of approximately 85 degrees in a currently preferred embodiment. The reflected light 711 from the field 140a of semiconductor wafer 100 is reflected at an angle 713 equal to angle 712. As discussed in relation to FIG. 4, camera 750 is positioned at this angle 713 so that reflected light 711 strikes the lens 751 of camera 750, and is focused on the imaging array in the region examined by the OCR system, making the field appear bright. As mentioned previously, light from characters present in the region 140 is widely scattered. Thus the characters appear dark in comparison to the field 140a. As mentioned previously, this type of lighting scheme would be used, for example, for scribe mark 201 of FIG. 2B.

High angle dark field assembly 702 with light guide 600 emits incident light 720 at an angle 722 of approximately 10° in a currently preferred embodiment. Light guide assembly 702 can be adjusted in the direction shown as 725, such that the angle at which it strikes wafer 100 in the region 140 can be varied from approximately 0° to 30°. As mentioned earlier, camera 750 is positioned at an angle equal to the angle 712 of reflected light 711. Since high angle dark field light 720 hits the wafer at a different angle, specularly reflected light 721 strikes the lens 751 of camera 750 well away from the center of the lens, and is focused on the imaging array in a region not examined by the OCR system. Therefore in the region examined by the OCR system, the field 140a in the region 140 appears dark. Referring to FIG. 3, much of the incident light 310 striking scribe mark 301 is reflected at a very slight angle compared with light 311 specularly reflected from the field 140a. Since camera 750 is positioned at a slight angle to the specularly reflected light 721, much of incident light 720 striking a scribe mark 301, will reach the camera. Thus, when using high angle dark field assembly 702, in the region 140 where the characters are present, the field 140a will appear dark but the characters will appear light on the portion of the imaging array examined by the OCR system. Thus, high angle dark field assembly 702 will generate a dark field image with good contrast for marks such as scribe mark 301 of FIG. 3. It should be noted that beam 720 from dark field high angle light assembly 702 is directed through light guide 405 of light source 701. Since the light guide 405 is optical quality acrylic, very little of light beam 720 is lost. This arrangement has the advantage that both of these light sources 701 and 702 can be provided in a compact arrangement minimizing system cost, complexity, and size.

Also shown in FIG. 7 are low angle light sources 703. In a currently preferred embodiment two of such light sources 703 are used. As can be seen, the light beam 730 coming from light sources 703 strike wafer 100 at a very low angle. Thus, light reflected specularly from the field 140a in the region 140 is reflected at the same glancing angle and will not reach camera 750. However, for scribe marks such as scribe mark 201 of FIGS. 2, light striking the scribe mark 201 will be scattered at high angles in all directions, as discussed in conjunction with FIG. 2C. Thus, a significant amount of incident light 730 which strikes the characters of the wafer ID 101, such as reflected light 275 of FIG. 2C, will be reflected directly up into the camera. Again, the field 140a will appear dark while the characters appear bright due to the scattered light. The light sources 703 are used, for example, on wafers with the edge bead problem described in relation to FIG. 1. As mentioned earlier, the edge bead removal marks do not give rise to much high angle scattering. Rather, they are of differing reflectivity. Thus, light striking the edge bead marks in the field will be specularly reflected, (although attenuated) but not significantly scattered toward the camera. Therefore, most scattered light reaching the camera will be that coming from the characters. Therefore the edge bead removal marks will cause no change in the contrast allowing for reading of wafers with edge bead removal marks. In addition, wafer IDs 101 having similar marks, such as thin films of deposited materials or organic materials, which may obscure the marks due to differing reflectivity or absorption characteristics, but which do not give rise to significant high angle scattering, can be read using light source 703.

Also shown in FIG. 7 is band pass filter 752. As mentioned previously, this filter allows only those wavelengths of light at which the LED 501 and 601 emit light. Therefore any stray light of other wavelengths striking either the field or the characters from other directions from other sources in the environment will not reach the imaging array of camera 750.

In the present invention the selection of which of the light sources shown in FIG. 7 and the light intensity to be used on a wafer to be identified, can be done manually by an operator, or can be performed automatically. In the prior art, the effectiveness of a light source or intensity is often determined by scanning the entire field and using the source or intensity giving the highest overall contrast in the field. The present invention provides a novel method for determining which source gives the best contrast, and consequently the best accuracy, by examining only the top and bottom edges of the characters. The method of the present invention is illustrated in conjunction with FIGS. 8, 9 and 10. As shown by step 800, a first light source is selected to be tested. This could be any one of assemblies 701, 702, or 703 of FIG. 7. Next, as shown by step 801 of FIG. 8 the image is acquired. Next, an analog to digital conversion is performed wherein a pixel data structure having 6 bit location (64 gray scale levels) for each pixel is created. If one of the previously described dark field illumination methods is used, the image is inverted by reversing polarity on the A to D converter. Thus, in the data structure, all images appear as bright field images. A portion of the data structure is shown in FIG. 9. A zero is placed in each location which has a low intensity. Although as stated above each pixel is one of 64 gray levels, for simplicity the method of the present invention will be discussed in terms of a single bit pixel being either off or on. It will be obvious to one skilled in the art how the method of the present invention is carried out on data structures having pixels with any number of gray levels. All regions where no zero appears are assumed to be one.

Figure 8:
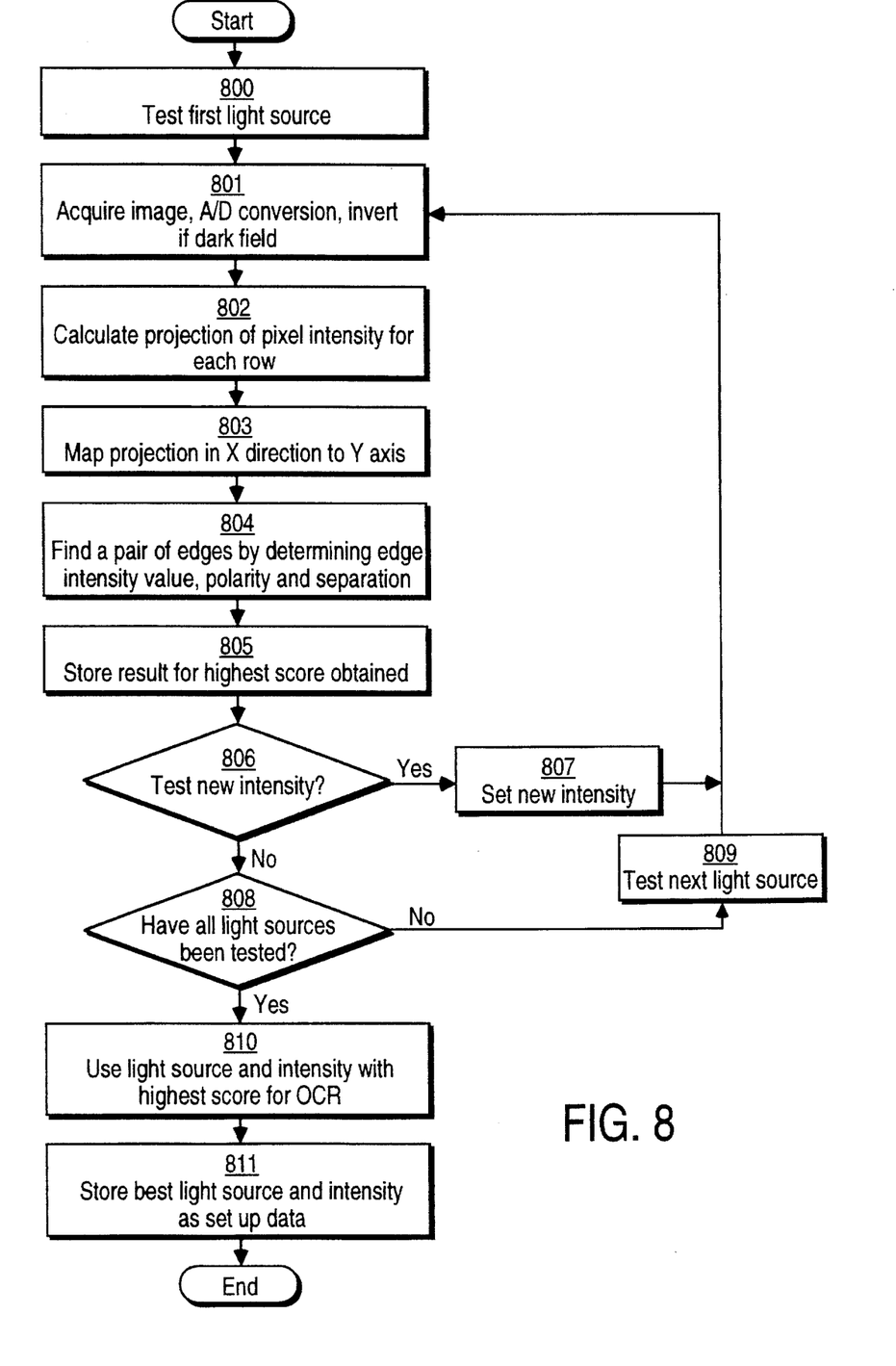
FIG. 8 shows a flow chart in a currently preferred embodiment of the light source and intensity selection of the present invention.
Figure 9:
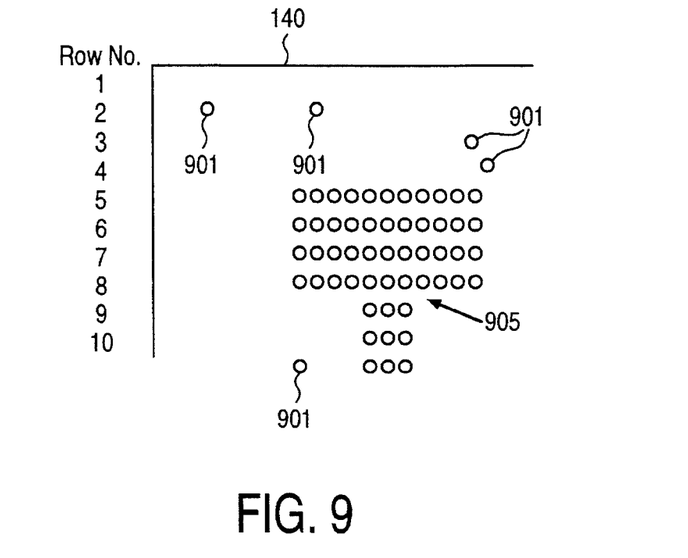
FIG. 9 shows a representation of a pixel data structure in a currently preferred embodiment of the present invention.
Figure 10:
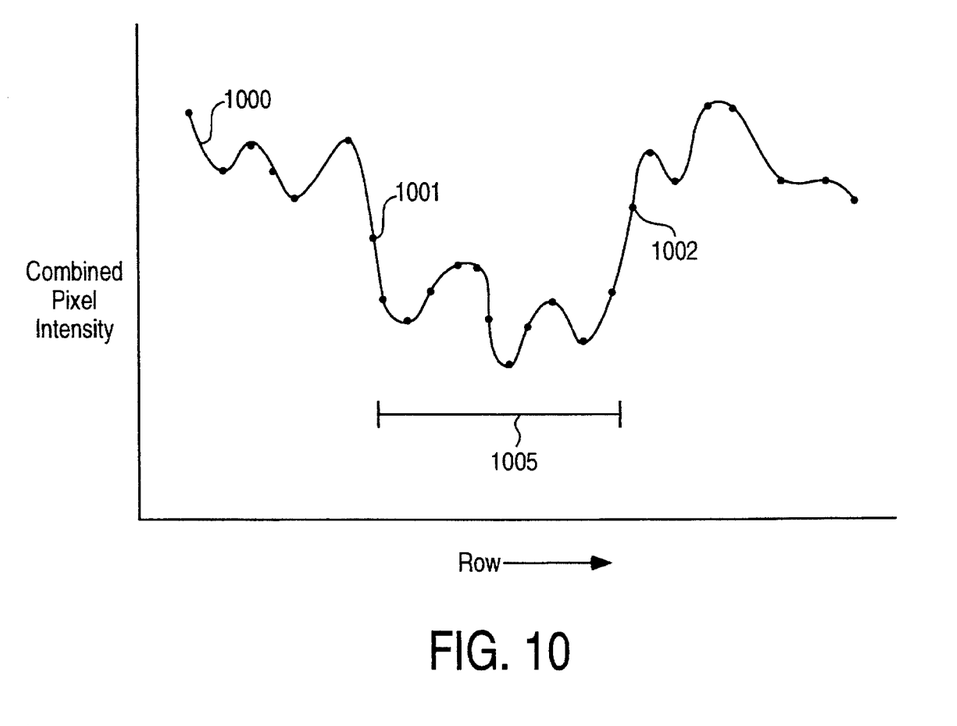
FIG. 10 shows a representation of a projection of each row in the pixel data struction of FIG. 9.

In FIG. 9, a portion of region 140 is shown. As can be seen in row number one in the section shown, there are no zeros (dark pixels). Of course, to the right of the region shown in the Figure there may be some dark pixels in this row. It will be understood that FIG. 9 shows only a portion of the region 140 examined by the present method. Next, as can be seen in the Figure, row two contains a couple of dark pixels. These could be due to blemishes on the surface of wafer 100, noise in the data, or other factors causing the pixel to be dark. As can be seen, starting at row five there are several pixels in a row which are dark. Similarly row 6–10 have several dark pixels. The group of dark pixels 905 could be, for example, the top of a letter such as the letter T. It will be understood that an edge of a letter may contain more or less pixels than that shown. Referring again to FIG. 8, as shown by step 802, a projection for each row is calculated. That is, the intensity value of all pixels in each row is summed. Next, as shown by step 803, this projection in the x direction is mapped to the y axis. The result of this is shown in FIG. 10. In FIG. 10 the x axis shows the number of the row corresponding to the row numbers in FIG. 9. The y axis gives a value of the combined pixel intensity for all pixels in each row. As can be seen, both the left and right sides of curve 1000 have high values. This corresponds to the fact that in most situations above and below the characters most pixels will be bright (recalling that a dark field image is inverted, so that the image in these regions will appear bright in the data structure of FIG. 9). The center portion shows where there is a much lower combined pixel intensity due to the presence of the characters.

Next, as shown by step 804 of FIG. 8, a pair of edges is found. To find a pair of edges, an edge intensity for each row is calculated. The edge intensity for each row is equal to the difference between the combined pixel intensity for the immediately succeeding row and the combined pixel intensity for the immediately preceding row. Next, the edge polarity is determined. The edge polarity is either positive or negative for a given row based upon whether the immediately succeeding row has a lesser combined pixel intensity than the immediately preceding row or a greater combined pixel intensity. For example, the row corresponding to data point 1001 of FIG. 10 would have a negative polarity since the combined pixel intensity of the succeeding row is less than that of the preceding row, whereas the row corresponding to data point 1002 will have a positive polarity since the combined intensity of the succeeding row is greater than that of the preceding row. Finally, each edge having an edge intensity above a predetermined threshold and a positive polarity is paired with each edge having an intensity above the threshold value and a negative polarity, to form edge pairs to be assigned a score. Every edge pair is assigned a score based on the combined edge intensity value for the edge pair and the separation distance between the rows of the pair. The calculation used to score each edge pair is as follows in a currently preferred embodiment:

$$\text{Score} = \sqrt{1000\left(1 - \left(\frac{D-E}{E}\right)\right) * 1000 \frac{\text{Value}}{\text{Max}}}$$

where D is the separation distance between the two rows in the pair, E is the character height, Value is the combined edge intensity, and Max is the maximum possible edge intensity (i.e., the intensity value if all pixels in the succeeding row had an intensity level of 0, and all pixels in the preceeding row had an intensity level of 63, or vice versa, for the currently preferred embodiment having 64 gray levels.) As can be seen from the formula, the highest possible score is 1000. Thus, the pair of edges will satisfy the conditions that each row has a high edge intensity value, the two edges have opposite polarity, and there is a separation distance equal to or close to the height of the character. Referring to FIG. 10, for example, distance 1005 shows the height of the character. Therefore, the rows corresponding to the data points 1001 and 1002, may have the highest score, based upon their high edge intensity value, opposite polarities and the fact that they are separated by the distance 1005 corresponding to the height of a character.

Next as shown by step 805 of FIG. 8 the highest score for a pair of edges is stored along with the light source and intensity used. Next, as shown by step 806, a determination is made as to whether a different light intensity for the light source being used, should be tested in order to find the best intensity for the light source being tested. In a currently preferred embodiment, the various light sources have 256 intensity levels. In step 806, a new intensity will be tested until a peak intensity (intensity giving highest score through steps 801 through 805) for the light source being tested is found. In a currently preferred embodiment, the 256 intensity levels are first stepped through in 10 equal increments (e.g., start at 55, then 75, etc.) to determine the score as a function of light intensity and to find an initial peak intensity. Prior to performing the steps 801–805 for an intensity level the mean pixel value and standard deviation for all pixels is determined. If the mean pixel value is above or below a certain threshold, signifying that the image is almost completely bright or completely dark, or is the standard deviation is below a certain threshold, signifying poor contrast, then the intensity level is not tested through the steps 801–805 in order to save time. Each intensity level which is not eliminated as described above is tested through steps 801–805 to find a pair of edges yielding the highest score for that intensity level.

Next, in a currently preferred embodiment, further intensities are tested in steps 806 and 807, based upon the initial peak intensity. First, based upon the trend shown when determining the initial intensity, three intensity levels in increments of 6 near the initial peak are tested. For example, if the initial peak intensity had been at an intensity level of 215, and the highest score for a pair of edges appeared to be rising at that point, then intensity levels such as 215, 221 and 227 would be tested, to find an intermediate peak. Finally, the final peak intensity is determined in a similar manner by testing three intensity levels at or near the intermediate peak in increments of three. It will be appreciated by one skilled in the art that many different routines for determining the peak intensity can be used in the present invention. After the final peak intensity has been found, so that no new intensity is tested in step 806, the score of the pair of edges having the highest score, along with the intensity value at which the highest score occurred, for the light source being tested, is stored for comparison with the highest score at peak intensity for other light sources, as described below.

Next, as shown by step 808 it is determined whether all light sources have been tested. If not, then, as shown by step 809 the next light source is tested, and the processing returns to step 801. If all light sources have been tested, the light source and intensity achieving the highest score is used for optical character recognition as shown by step 810. After the ID has been read, as shown by step 811 the best type of light source and intensity for that ID number is stored. For example, if for the wafer ID 101 ABC-123 shown in FIG. 1, bright field source 701 at a certain intensity level had given the highest score, then that fact could be stored in the OCR system as set up data to be used for the rest of the lot, for example.

The use of LEDs as a light source has a further advantage in the present invention in conjunction with the intensity selection described above. Prior art lighting techniques commonly require up to 50 milliseconds or more to stabilize. The LEDs of the present invention require only 2–4 milliseconds to stabilize. Therefore, the testing of each light source at various intensities can be carried out rapidly compared with the prior art. Therefore, all light sources and intensities can be quickly tested to determine which will give the highest accuracy, without significantly impacting throughput time.

Thus a novel illumination method and apparatus for optical character recognition has been described. Bright field illumination is provided without the use of costly lenses and beam splitters. A single system providing bright field illumination, high angle dark field illumination and low angle dark field illumination is disclosed. A novel method of selecting the illumination giving the best contrast has also been described. Finally, also disclosed are novel, inexpensive light guides.

What is claimed is:

1. An apparatus for illuminating a region of a surface of a substrate, said surface defining a plane, said region comprising a smooth planar field which reflects radiation incident thereon substantially specularly and a marking which reflects non-specularly and/or scatters and/or absorbs a portion of radiation incident thereon, said apparatus comprising:

a first radiation source assembly, said first radiation source assembly emitting a first incident beam of radiation which strikes said region at a first angle of incidence, said first angle of incidence being greater than 0 degrees to a normal vector to said plane, said first incident beam having a first reflected beam having a corresponding first angle of reflection from said plane, said first radiation source assembly comprising:

a first radiation source;

a first radiation guide having said first radiation source disposed therein, said first radiation guide being substantially transparent to said radiation, said first radiation guide having a plurality of surfaces including an exit surface and a diffuse reflecting surface, wherein said radiation from said first radiation source striking said surfaces other than said exit surface and said diffuse reflecting surface is internally reflected to said diffuse reflecting surface, and wherein said radiation striking said diffuse reflecting surface from said other surfaces and from said first radiation sources is reflected diffusely through said exit surface;

a second radiation source assembly, said second radiation source assembly emitting a second incident beam of radiation which strikes said region at a second angle of incidence, wherein said field reflects a second reflected beam of radiation at a corresponding second angle of reflection, said second radiation source assembly comprising:

a second radiation source;

a second radiation guide having said second radiation source disposed therein, said second radiation guide being substantially transparent to said radiation, said second radiation guide having a plurality of surfaces including an exit surface, wherein substantially all of said radiation from said second radiation source striking said surfaces other than said exit surface is internally reflected to said exit surface, such that substantially all of said radiation emitted by said radiation source exits said second radiation guide through said exit surface: and a detector, said detector positioned at approximately said first angle of reflection from said surface such that said first reflected beam strikes a detection region of said detector and such that said second reflected beam does not strike said detection region.

2. The apparatus of claim 8 further comprising a third radiation source assembly, said third radiation source assembly emitting a third incident beam of radiation which strikes said region at a third angle of incidence, wherein said field reflects a third reflected beam of radiation at a corresponding third angle of reflection, such that said third reflected beam does not strike said detection region.

3. The apparatus as described in claim 2 wherein said first, said second and said third incident beams of radiation have a wavelength in a determined range, and wherein said detector comprises a filter which passes radiation in said determined range and blocks at least some radiation outside of said range from reaching said detector.

4. The apparatus of claim 1 wherein said first radiation source assembly comprises a first radiation guide transparent to said radiation, and wherein said second beam of incident radiation from said second radiation source assembly is transmitted through said first radiation guide.

5. The apparatus as described in claim 1 wherein said first and said second incident beams of radiation have a wavelength in a determined range, and wherein said detector comprises a filter which passes radiation in said determined range and blocks at least some radiation outside of said range from reaching said detector.

6. A method of illuminating a region of a surface of a substrate, said surface defining a plane, said region comprising a smooth planar field which reflects radiation incident thereon substantially specularly and a marking which reflects non-specularly and/or scatters and/or absorbs a portion of radiation incident thereon, method comprising the steps of:

providing a first incident beam of radiation which strikes said region at a first angle of incidence, said first angle of incidence being greater than 0 degrees to a normal vector to said plane, said first incident beam having a first reflected beam having a corresponding first angle of reflection from said plane:

providing a second incident beam of radiation which strikes said region at a second angle of incidence, wherein said field reflects a second reflected beam of radiation at a corresponding second angle of reflection;

detecting reflected radiation in a detection region of a detector, said detection region positioned at approximately said first angle of reflection from said surface, such that said second reflected beam does not strike said detection region; and determining which of said first incident beam and said second incident beam provides the best contrast between said field and said marking.

7. The method as described in claim 6 wherein said step of determining which of said incident beams provides the best contrast comprises the steps of:

acquiring an image of said region of said substrate from said detection region of said detector;

forming a data structure, said data structure having data locations corresponding to pixels of said image;

determining a score for each of a plurality of selected pairs of rows of said data structure, said score corresponding to contrast between said marking and said field at a top and at a bottom edge of said marking;

selecting a first beam best score for said first incident beam and a second beam best score for said second incident beam; and comparing said first beam best score and said second beam best score to determine which beam provides the best contrast.

8. A method of illuminating a region of a surface of a substrate, said surface defining a plane, said region comprising a smooth planar field which reflects radiation incident thereon substantially specularly and a marking which reflects non-specularly and/or scatters and/or absorbs a portion of radiation incident thereon, said method comprising the steps of:

providing a first incident beam of radition which strikes said region at a first angle of incidence, said first angle of incidence being greater than 0 degrees to a normal vector to said plane, said first incident beam having a first reflected beam having a corresponding first angle of reflection from said plane;

providing a second incident beam of radiation which strikes said region at a second angle of incidence, wherein said field reflects a second reflected beam of radiation at a corresponding second angle of reflection;

providing a third incident beam of radiation which strikes said region at a third angle of incidence, wherein said field reflects a third reflected beam of radiation at a corresponding third angle of reflection;

detecting reflected radiation in a detecting region of detector, said detection region positioned at approximately said first angle of reflection from said surface, such that said second reflected beam and said third reflected beam do not strike said detection region; and determining which of said first incident beam, said second incident beam, and said third incident beam provides the best contrast between said field and said marking.

9. The method as described in claim 8 wherein said step of determining which of said incident beams provides the best contrast comprises the steps of:

acquiring an image of said region of said substrate from said detection region of said detector;

forming a data structure, said data structure having data locations corresponding to pixels of said image;

determining a score for each of a plurality of selected pairs of rows of said data structure, said score corresponding to contrast between said marking and said field at a top and at a bottom edge of said marking;

selecting a first beam best score for said first incident beam, a second beam best score for said second incident beam and a third beam best score for said third incident beam; and, comparing said first beam best score, said second beam best score and said third beam best score to determine which beam provides the best contrast.

10. An apparatus for illuminating a region of a surface of a substrate, said surface defining a plane, said region comprising a smooth planar field which reflects radiation incident thereon substantially specularly and a marking which reflects non-specularly and/or scatters and/or absorbs a portion of radiation incident thereon, said apparatus comprising:

a first radiation source assembly, said first radiation source assembly emitting a first incident beam of radiation which strikes said region at a first angle of incidence, said first angle of incidence being greater than 0 degrees to a normal vector to said plane, said first incident beam having a first reflected beam having a corresponding first angle of reflection from said plane;

a second radiation source assembly, said second radiation source assembly emitting a second incident beam of radiation which strikes said region at a second angle of incidence, wherein said field reflects a second reflected beam of radiation at a corresponding second angle of reflection;

a detector, said detector positioned at approximately said first angle of reflection from said surface such that said first reflected beam strikes a detection region of said detector and such that said second reflected beam does not strike said detection region; and a selector, wherein said selector determines which of said first incident beam and said second incident beam provides the best contrast between said field and said marking.

11. The apparatus of claim 10 wherein said first radiation source assembly comprises a first radiation guide transparent to said radiation, and wherein said second beam of incident radiation from said second radiation source assembly is transmitted through said first radiation guide.

12. The apparatus of claim 10 wherein said first radiation source assembly comprises:

a first radiation source;

a first radiation guide having said first radiation source disposed therein, said first radiation guide being substantially transparent to said radiation, said first radiation guide having a plurality of surfaces including an exit surface and a diffuse reflecting surface, wherein said radiation from said first radiation source striking said surface other than said exit surface and said diffuse reflecting surface is internally reflected to said diffuse reflecting surface, and wherein said radiation striking said diffuse reflecting surface from said other surfaces and from said first radiation source is reflected diffusely through said exit surface.

13. The apparatus of claim 10 wherein said second radiation source assembly comprises:

a second radiation source;

a second radiation guide having said second radiation source disposed therein, said second radiation guide being substantially transparent to said radiation, said second radiation guide having a plurality of surfaces including an exit surface, wherein substantially all of said radiation from said second radiation source striking said surfaces other than said exit surface is internally reflected to said exit surface, such that substantially all of said radiation emitted by said radiation source exits said second radiation guide through said exit surface.

14. The apparatus as described in claim 10 wherein said first and said second incident beams of radiation have a wavelength in a determined range, and wherein said detector comprises a filter which passes radiation in said determined range and blocks at least some radiation outside of said range from reaching said detector.

15. An apparatus for illuminating a region of a surface of a substrate, said surface defining a plane, said region comprising a smooth planar field which reflects radiation incident thereon substantially specularly an a marking which reflects non-specularly and/or scatters and/or absorbs a portion of radiation incident thereon, said apparatus comprising:

a first radiation source assembly, said first radiation source assembly emitting a first incident beam of radiation which strikes said region at a first angle of incidence, said first angle of incidence being greater than 0 degrees of a normal vector to said plane, said first incident beam having a first reflected beam having a corresponding first angle of reflection from said plane;

a second radiation source assembly, said second radiation source assembly emitting a second incident beam of radiation which strikes said region at a second angle of incidence, wherein said field reflects a second reflected beam of radiation at a corresponding second angle of reflection;

a third radiation source assembly, said third radiation source assembly emitting a third incident beam of radiation which strikes said region at a third angle of incidence, wherein said field reflects a third reflected beam of radiation at a corresponding third angle of reflection; and a detector, said detector positioned a approximately said first angle of reflection from said surface such that said first reflected beam strikes a detection region of said detector and such that said second and third reflected beams do not strike said detection region; and a selector, wherein said selector determines which of said first incident beam, said second incident beam, and said third incident beam provides the best contrast between said field and said marking.

16. The apparatus of claim 15 wherein said first radiation source assembly comprises a first radiation guide transparent to said radiation, and wherein said second beam of incident radiation from said second radiation source assembly is transmitted through said first radiation guide.

17. The apparatus of claim 15 wherein said first radiation source assembly comprises:

a first radiation source;

a first radiation guide having said first radiation source disposed therein, said first radiation guide being substantially transparent to said radiation, said first radiation guide having a plurality of surfaces including an exit surface and a diffuse reflecting surface, wherein said radiation from said first radiation source striking said surfaces other than said exit surface and said diffuse reflecting surface is internally reflected to said diffuse reflecting surface, and wherein said radiation striking said diffuse reflecting surface from said other surfaces and from said first radiation source is reflected diffusely through said exit surface.

18. The apparatus of claim 15 wherein said second radiation source assembly comprises:

a second radiation source;

a second radiation guide having said second radiation source disposed therein, said second radiation guide being substantially transparent to said radiation, said second radiation guide having a plurality of surfaces including an exit surface, wherein substantially all of said radiation from said second radiation source striking said surfaces other than said exit surface is internally reflected to said exit surface, such that substantially all of said radiation emitted by said radiation source exits said second radiation guide through said exit surface.

19. The apparatus as described in claim 15 wherein said first, said second and said third incident beams of radiation have a wavelength in a determined range, and wherein said detector comprises a filter which passes radiation in said determined range and blocks at least some radiation outside of said range from reaching said detector.

* * * * *

UNITED STATES PATENT AND TRADEMARK OFFICE
CERTIFICATE OF CORRECTION

PATENT NO. : 5,515,452
DATED : May 7, 1996
INVENTOR(S) : Penkethman et al.

It is certified that error appears in the above-identified patent and that said Letters Patent is hereby corrected as shown below:

Column 12,
Line 1, please delete "claim 8" and insert -- claim 1 --.

Column 15,
Line 4, please delete "an" and insert -- and --.
Line 12, please delete "of" and insert -- to --.

Signed and Sealed this

Eighteenth Day of October, 2005

JON W. DUDAS
*Director of the United States Patent and Trademark Office*